United States Patent
Nakagawa et al.

(10) Patent No.: US 7,348,681 B2
(45) Date of Patent: Mar. 25, 2008

(54) ELECTRONIC COMPONENT AND MANUFACTURING METHOD OF THE ELECTRONIC COMPONENT

(75) Inventors: Kazuya Nakagawa, Matusaka (JP); Yutaka Abe, Taki-gun (JP); Toshiyuki Suzuki, Nara (JP)

(73) Assignee: Matsushita Electric Works, Ltd., Osaka (JP)

( * ) Notice: Subject to any disclaimer, the term of this patent is extended or adjusted under 35 U.S.C. 154(b) by 106 days.

(21) Appl. No.: 10/574,017

(22) PCT Filed: Jun. 16, 2005

(86) PCT No.: PCT/JP2005/011028

§ 371 (c)(1),
(2), (4) Date: Mar. 29, 2006

(87) PCT Pub. No.: WO2006/001211

PCT Pub. Date: Jan. 5, 2006

(65) Prior Publication Data

US 2007/0120272 A1    May 31, 2007

(30) Foreign Application Priority Data

Jun. 25, 2004    (JP)    ............... 2004-188781

(51) Int. Cl.
*H01L 23/28*    (2006.01)

(52) U.S. Cl. ............ 257/787; 257/687; 257/667; 438/26; 438/127

(58) Field of Classification Search ........ 257/787–790, 257/795, 667, 687, 704; 438/106, 107, 110–112, 438/120–127, 26
See application file for complete search history.

(56) References Cited

U.S. PATENT DOCUMENTS 5,904,506 A * 5/1999 Yoneda et al. ............. 438/124

(Continued)

FOREIGN PATENT DOCUMENTS

JP    11-074420    3/1999

(Continued)

OTHER PUBLICATIONS

English Language Abstract of JP 11-074420.

(Continued)

*Primary Examiner*—Zandra V. Smith
*Assistant Examiner*—Paul E Patton
(74) *Attorney, Agent, or Firm*—Greenblum & Bernstein, P.L.C.

(57) ABSTRACT

In an electronic component in which a semiconductor device such as a light emitting diode is encapsulated by an encapsulation resin and a manufacturing method of the same, formation of flash on occasion of filling a resin is prevented. The semiconductor device (SIC) is mounted in a reception concavity of a base member, and the encapsulation resin is filled into the reception concavity. After mounting the semiconductor device in the reception concavity and before filling the encapsulation resin into the reception concavity, a stopper resin layer is formed on a top face of the base member along a circumference of an aperture of the reception concavity by applying a resin. Since the circumference of the aperture of the reception concavity including electric conductive patterns and the base member is covered by the stopper resin layer, even when the encapsulation resin having low viscosity is filled into the reception concavity, leakage or proceeding due to capillarity of the encapsulation resin is prevented by the stopper resin layer. As a result, no flash of leaked encapsulation resin is formed.

9 Claims, 10 Drawing Sheets

U.S. PATENT DOCUMENTS

| | | |
|---|---|---|
| 6,707,166 B1 | 3/2004 | Noguchi |
| 6,753,196 B2 | 6/2004 | Komoda et al. |
| 2004/0012958 A1* | 1/2004 | Hashimoto et al. ......... 362/241 |

FOREIGN PATENT DOCUMENTS

| | | |
|---|---|---|
| JP | 2001-230347 | 8/2001 |
| JP | 2003-168829 | 6/2003 |
| JP | 2003-273292 | 9/2003 |

OTHER PUBLICATIONS

English Language Abstract of JP 2003-168829.
English Language Abstract of JP 2001-230347.
English Language Abstract of JP 2003-273292.

* cited by examiner

ELECTRONIC COMPONENT AND MANUFACTURING METHOD OF THE ELECTRONIC COMPONENT

TECHNICAL FIELD

The present invention relates to an electronic component formed by encapsulating a semiconductor device with an encapsulation resin and a manufacturing method of the electronic component.

BACKGROUND ART

An electronic component formed by encapsulating a semiconductor device such as a light emitting diode with an encapsulation resin is conventionally supplied (referring to, for example, Japanese Laid-Open Patent Publication No. 11-074420). Examples of such a conventional electronic component and method for manufacturing the same are shown in FIGS. 6A to 6D. As shown in FIG. 6D, in a conventional electronic component 100, a reception concavity 103 is formed on a base member 102, and individual electrical conduction patterns 104 are formed along the reception concavity 103 from both sides of the base member 102. A semiconductor device 101 is mounted on lands 104b in the reception concavity 103. Furthermore, the semiconductor device 101 is encapsulated by an encapsulation resin 105 which is filled up in the reception concavity 103.

The processes for manufacture the conventional electronic component 100 is described. First, as shown in FIG. 6A, a channel 103a having a substantially trapezoid sectional shape is formed on a face of a base substrate 102a formed in substantially rectangular parallelepiped shape with synthetic resin or ceramics. Then, an electric conductive pattern 104a which is an aggregation of individual electric conductive patterns 104 is formed on surfaces of the base substrate 102 including the channel 103a with using insert molding or an MID (Mold Interconnect Device) technique. In a portion formed in the channel 103a among the electric conductive pattern 104a, a plurality of lands 104b, to which semiconductor devices 101 are mounted, is arranged on a line at a predetermined pitch. Subsequently, as shown in FIG. 6B, a plurality of the semiconductor devices 101 is mounted on the above lands 104b. Furthermore, as shown in FIG. 6C, an encapsulation resin 105 is filled up in the channel 103a so that each semiconductor device 101 is encapsulated with the encapsulation resin 105. Finally, as shown in FIG. 6D, the base substrate 102a is cut off in cross direction between each land 104b arranged on the straight line. Thereby, individual electronic component 100 is finished.

In order to fill up the channel 103a with encapsulation resin 105, as shown in FIG. 7B, a die 106 which covers up the channel 103a is closely contacted on the base substrate 102a in a condition shown in FIG. 7A or 6D, that is, the condition that the semiconductor devices 101 are mounted on the lands 104b. Then, the encapsulation resin 105 is filled up between the die 106 and the base substrate 102a, as shown in FIG. 7C. After hardening the encapsulation resin 105, the die 106 is taken off, as shown in FIG. 7D.

According to such a conventional method for manufacturing the electronic component, as shown in FIGS. 6A to 6D, the electric conductive pattern 104a is formed along the overall length of the base substrate 102a, and along both side portions of the channel 103a on the top face of the base substrate 102a. Thus, it is possible to form a face, to which the die 106 is disposed, as a flat face constituted by only the electric conductive pattern 104a, as shown in FIG. 7B. Therefore, at least in an area that can be separated for the electronic component 100 as shown in FIG. 6D, the die 106 can be closely contacted on the electric conductive pattern 104a as shown in FIG. 7B, so that leakage of the encapsulation resin 105 can be prevented. As a result, no flash due to the leakage of the encapsulation resin 105 is formed.

On the other hand, in case that the manufacturing method shown in FIGS. 6A to 6D cannot be adopted such as a case of making a width of individual electric conductive pattern 104 narrower than a width of the base member 102, it is necessary to provide a plurality of the electrical conductive patterns 104 with a condition that separated each other as shown in FIG. 8. In such case, an irregularity occurs around the reception concavity 103 on the top face of the base member 102 due to the electric conductive patterns 104. Then, for filling up the encapsulation resin 105 with using the die 106 as shown in FIGS. 7A to 7D, it is necessary to form an irregularity on a lower end face of the die corresponding to the above irregularity. It, however, is difficult to put the shape of the irregularity formed on the lower end dace of the die 106 completely together with the shape of the irregularity due to the electric conductive patterns 104. Therefore, when the die 106 is disposed on the base substrate 102 as shown in FIGS. 9A and 9B, a clearance may be formed between the peripheries of the electric conductive pattern 104 and the die 106 as shown in FIG. 9C. When the clearance is formed between the die 106 and the electric conductive pattern 104, the encapsulation resin 105 may leak through the clearance, so that flash may be formed.

In addition, when the encapsulation resin 105 is injected into the reception concavity 103 by called potting shown by arrow A2 without using the die 106 as shown in FIGS. 10A and 10B, the encapsulation resin 105 comes in a space between the electric conductive pattern 104 and the base member 102 by capillarity as shown in FIG. 10C. Then, as shown by arrow A3, the encapsulation resin 105 may leak outside of the reception concavity 103, so that flash may be formed.

By the way, viscosity of the encapsulation resin 105 is generally low because it is necessary to flow to every corner of the reception concavity 103 with no not blowhole. Therefore, when the encapsulation resin begins to leak as above, flash may be formed in wide scope so that various harmful influences may be given in circumference. Furthermore, when the encapsulation resin 105 has leaked out, a thickness of the encapsulation resin layer essentially necessary may not be ensured, so that enough encapsulation advantageous effect may not be obtained. Still furthermore, flash may be formed by the leaked encapsulation resin 105, so that there may be a problem that the electronic component 100 of intended shape cannot be obtained.

Furthermore, when the electric conductive pattern 104 is easily wetted by the encapsulation resin 105 corresponding to combination of surface property of the electric conductive pattern 104 and property of the encapsulation resin 105, it is considered that the encapsulation resin 105 may leaks out through the surface of the electric conductive pattern 104 to outside of the reception concavity 103. In such a case, the encapsulation resin 105 may adhered on surfaces of various portions of the electric conductive pattern 104, so that conduction failure may occur between the electric conductive pattern 104 and a circuit board on which the electronic component 100 is mounted.

DISCLOSURE OF INVENTION

A purpose of the present invention is to provide an electronic component having desired shape and encapsulation advantageous effect that no flash due to leakage of encapsulation resin is formed, and to provide a manufacturing method thereof.

For accomplishing the above-mentioned purpose, an electric component in accordance with an aspect of the present invention comprises: a base member formed of an insulative material and having a reception concavity into which a semiconductor device is mounted; one or a plurality of electric conductive patterns formed along at least a bottom face and side faces of the reception concavity, and a top face of the base member on which an aperture of the reception concavity is formed among the base member, and electrically connected to the semiconductor device in the reception concavity; an encapsulation resin filled up in the reception concavity; and a stopper resin layer formed on the top face of the base member for covering at least boundaries of the electric conductive pattern and the base member in directions parallel to peripheries of the aperture of the reception concavity so as to prevent leakage or proceeding due to capillarity of the encapsulation resin.

In addition, a manufacturing method of electronic component in accordance with an aspect of the present invention relates to the manufacturing method of electronic component that a semiconductor device is mounted in a reception concavity of a base member and an encapsulation resin is filled into the reception concavity, and comprises the steps of applying a resin on a top face of the base member for covering at least boundaries of an electric conductive pattern and the base member in directions parallel to peripheries of an aperture of the reception concavity so as to form a stopper resin layer for preventing leakage or proceeding due to capillarity of the encapsulation resin, after mounting the semiconductor device in the reception concavity and before filling up an encapsulation resin into the reception concavity.

By such a configuration, even if the encapsulation resin will proceed through a space between the electric conductive pattern and the base member due to capillarity when the encapsulation resin is filled into the reception concavity, the proceeding of the encapsulation resin is prevented by the stopper resin layer. In addition, even though the electric conductive pattern is easily wetted by the encapsulation resin, the encapsulation resin diffused through a surface of the electric conductive pattern is prevented the diffusion thereof by the stopper resin. Thereby, no flash due to leaked encapsulation resin is formed.

BEST MODE FOR CARRYING OUT THE INVENTION

First Embodiment

An electronic component and a manufacturing method of the electronic component in accordance with a first embodiment of the present invention are described in detail with reference to figures.

Figure 1:
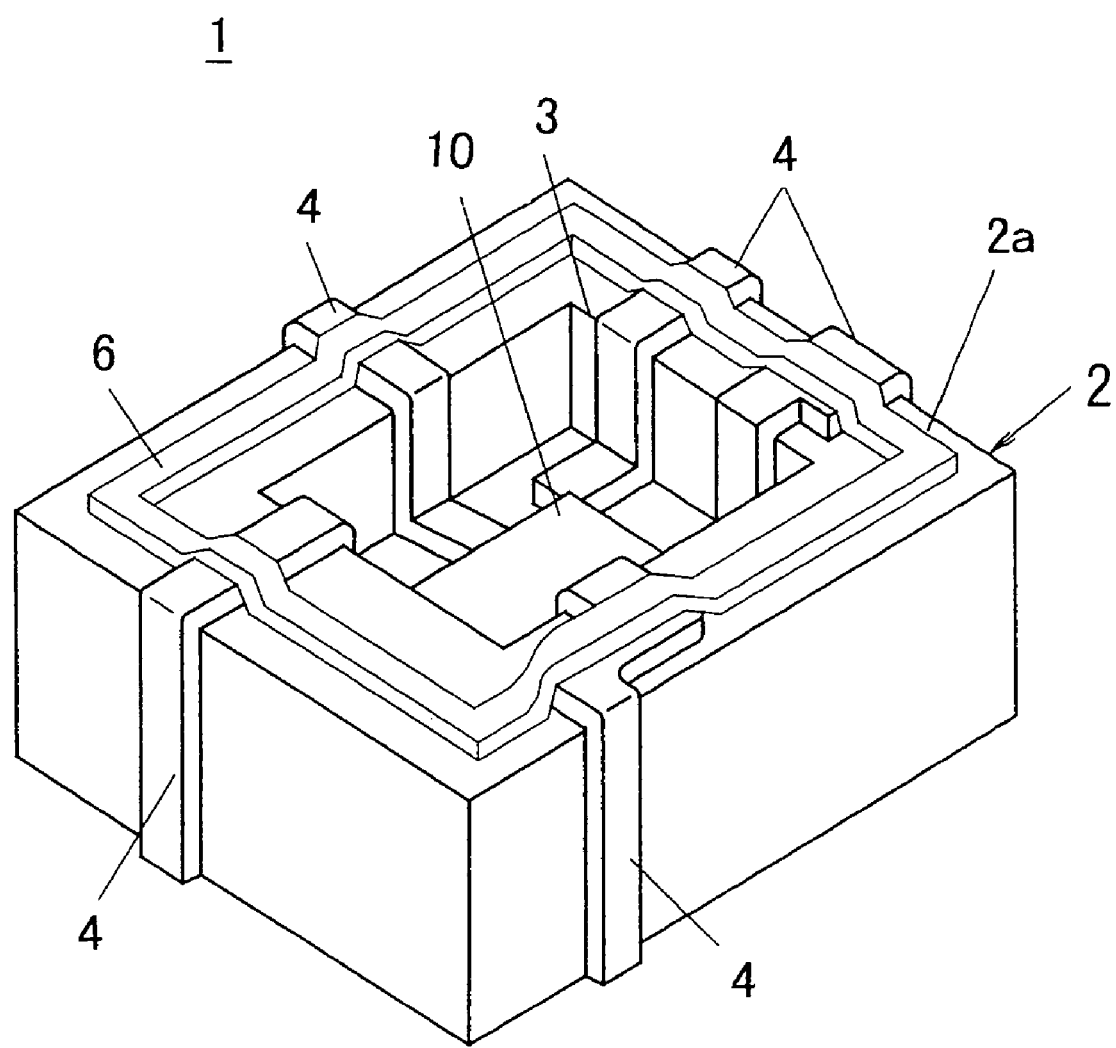
FIG. 1 is a perspective view showing a configuration of an electronic component in accordance with a first embodiment of the present invention in, and especially showing a state before filling an encapsulation resin into a reception concavity of a base member.

FIG. 1 is a perspective view showing a configuration of an electronic component 1 in accordance with the first embodiment, and especially shows a state before filling up an encapsulation resin into a reception concavity 3 of a base member 2. The base member 2 is a substantially rectangular parallelepiped shaped and formed of an insulative material such as a synthetic resin or ceramics, and the reception concavity 3 of substantially rectangular parallelepiped shape is formed on a top face 2a thereof. A plurality of conductive patterns 4 is formed along outside faces and a top face of the base member 2 and inside faces and a bottom face of the reception concavity 3. In addition, lands (not shown) to which a semiconductor device 10 is mounted are integrally formed with the electric conductive pattern 4 on the bottom face of the reception concavity 3.

The semiconductor device 10 is contained in an inside of the reception concavity 3 and mounted on the bottom face thereof. The electric conductive pattern 4 is, for example, a metal conductor such as copper which is inserted in injection molding with using synthetic resin, or a metal film formed on an insulative substrate made of ceramics with using the MID technique. A plurality of the electric conductive patterns 4 is provided in separated state each other corresponding to the case that the manufacturing method shown in FIGS. 6A to 6D cannot be adopted, for example, the case that a width of the electric conductive pattern 4 is made narrower than a width of the base member 2, as mentioned above. In addition, a stopper resin layer 6 is provided on the top face 2a of the bas member 2 so as to surround the aperture of the reception concavity 3 along entire circumference thereof. Besides, an encapsulation resin (not shown) is filled up into the reception concavity 3 of the base member 2 by the method, for example, shown in FIG. 10 so that the semiconductor device 10 mounted on the bottom face of the reception concavity 3 is encapsulated.

The stopper resin layer 6 is formed prior to filling up the reception concavity 3 with the encapsulation resin, so as to cover not only the top face 2a of the base member 2 but also entire widths of the electric conductive patterns 4 formed thereon along the aperture of the reception concavity 3. Furthermore, the stopper resin layer 6 is closely adhered to the electric conductive patterns 4 and the base member 2 so as not to form a clearance in a boundary between the stopper resin layer 6 and each of the electric conductive pattern 4 and the top face 2a of the base member 2.

As an example, a length of each side of the electronic component 1 is about several mm, a length of each side of the semiconductor device 10 to be mounted is about 1 mm, a depth of the reception concavity 3 is about 2 mm, and a thickness of the stopper resin layer 6 is about 0.1 mm. In this way, since the electronic component 1 in itself is very small, formation of flash or adhesion to the electric conductive pattern 4 due to leakage of the encapsulation resin may be the cause of failure of the electronic component 1. Therefore, it is effective to prevent the leakage of the encapsulation resin by the stopper resin layer 6. Although the stopper resin layer 6 remains after finishing the electronic component 1, the thickness thereof is very this as mentioned above. Thus, it may hardly affect the shape of the electronic component 1.

As for a material of the stopper resin layer 6, it is sufficient that an affinity with respect to the encapsulation resin is small enough, so that synthetic resin such as an epoxy type, a phenol type, an acrylic type, a polyurethane type, or a silicon type one can be used similar a solder resist. In addition, a method for forming the stopper resin layer 6, silk printing or nozzle application can be used. Besides, the material of the encapsulation resin is not limited in particular, but, for example, epoxy type resin can be used.

As for the material of the stopping resin layer 6, one having a viscosity higher than the viscosity of the encapsulation resin is used. Furthermore, a quantity of resin for the stopper resin layer 6 is smaller than a quantity of the encapsulation resin, a time necessary for hardening it is short. Thus, a process for forming the stopper resin layer 6 and a process for filling the encapsulation resin can be executed continuously in a relatively short time period. Still furthermore, since the stopper resin layer 6 has high viscosity and low fluidity even when it has not been hardened yet, it is possible to prevent the leakage of the encapsulation resin by the stopper resin layer 6 although the encapsulation resin is filled up into the reception concavity 3.

Figure 10A:
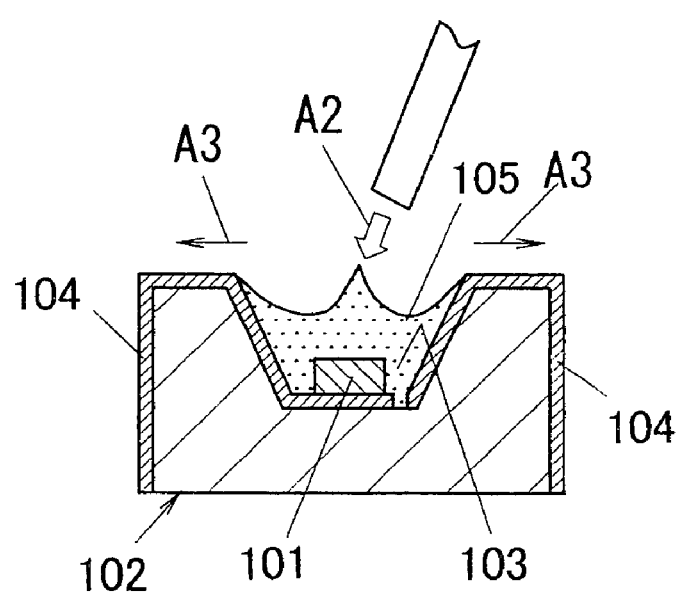
FIG. 10A is a sectional view showing an example of a method for filling up the encapsulation resin into the reception concavity of the above another conventional electronic component.
Figure 10B:
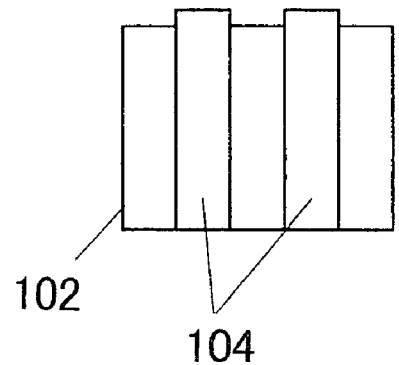
FIG. 10B is a side view of FIG. 10A.
Figure 10C:
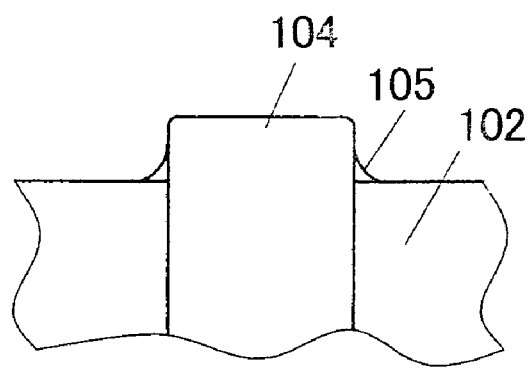
FIG. 10C is an enlarged view of an essential portion of FIG. 10B.

In this way, by providing the stopper resin layer 6 along the aperture of the reception concavity 3, even when the encapsulation resin is filled up into the reception cavity 3 with using the method, for example, shown in FIG. 10A, it is possible to prevent the proceeding of the encapsulation resin along a boundary between the electric conductive pattern 4 and the base member 2 due to capillarity by the stopper resin layer 6. Thus, leakage of the encapsulation resin can be prevented, so that no flash is formed. Furthermore, even when the surface performance of the electric conductive patter 4 is easy to be wetted by the encapsulation resin, the encapsulation resin which comes through the surface of the electric conductive pattern 4 is blocked by the stopper resin layer 6. Therefore, since an area on the surface of the electric conductive pattern 4 to which the encapsulation resin adheres is limited, conduction failure rarely occurs between the electric conductive pattern 4 and a circuit board to which the electronic component 1 is mounted due to adhesion of the encapsulation resin on various portions of the electric conductive pattern 4.

Figure 2:
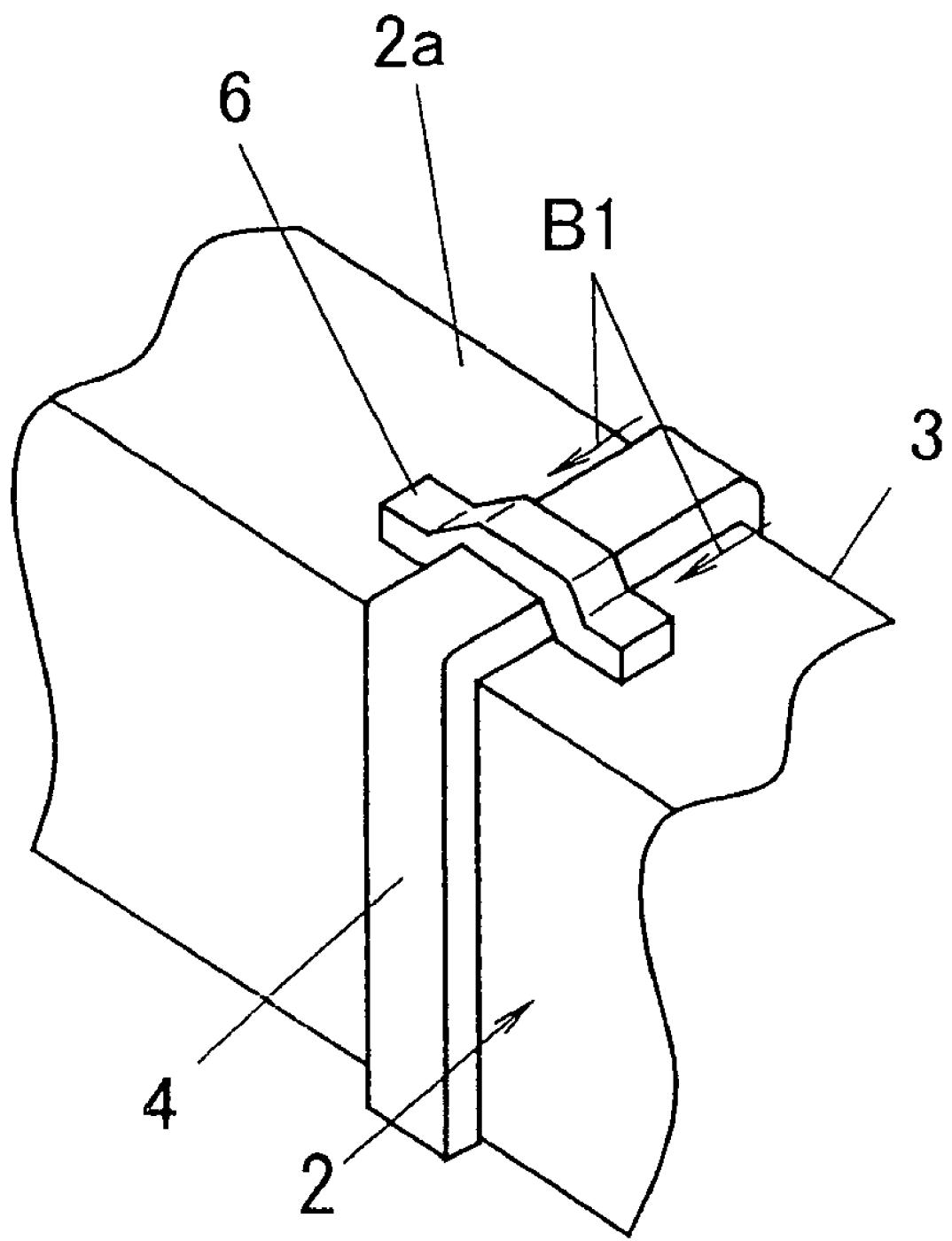
FIG. 2 is a perspective view showing an essential portion of another configuration of an electronic component in accordance with the first embodiment of the present invention.

Besides, the stopper resin layer 6 is not necessarily formed along the entire circumference of the aperture of the reception concavity 3. For example, even when it is formed, for example, only in the vicinity of the electric conductive pattern 4 as shown in FIG. 2, it is possible to prevent the proceeding of the encapsulation resin along the electric conductive pattern 4 shown by arrows B1.

Figure 3:
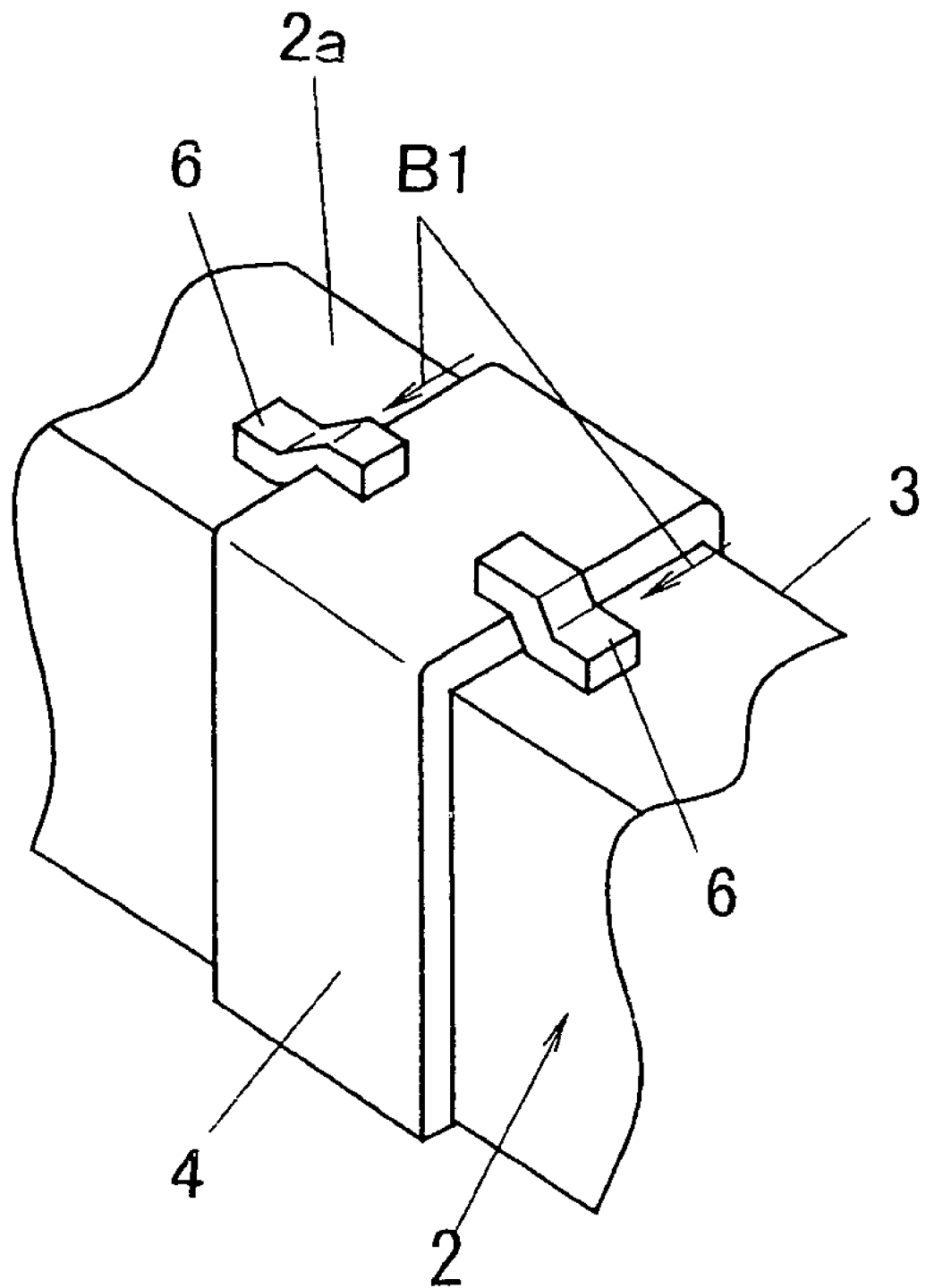
FIG. 3 is a perspective view showing an essential portion of still another configuration of an electronic component in accordance with the first embodiment of the present invention.

In addition, when the surface performance of the electric conductive pattern 4 is uneasy to be wetted by the encapsulation resin, it is sufficient to prevent only the proceeding of the encapsulation resin along the boundaries of the electric conductive pattern 4 and the base member 2 by capillarity. In such a case, it is possible to cover only the boundaries between the electric conductive pattern 4 and the base member 2 in the peripheral direction of the aperture of the receptacle concavity by the stopper resin layer 6, so that the stopper resin layer 6 may be discontinued on the electric conductive pattern 4, as shown in FIG. 3. When such a configuration is adopted, a necessary quantity of the resin can be reduced although the application control of resin for forming the stopper resin layers 6 becomes complex.

Second Embodiment

Subsequently, an electronic component and a manufacturing method of the electronic component in accordance with a second embodiment of the present invention are described in detail with reference to figures. However, elements of the electronic component in accordance with the second embodiment which are common with those in the above mentioned first embodiment are omitted by referred to the same reference numerals.

Figure 4A:
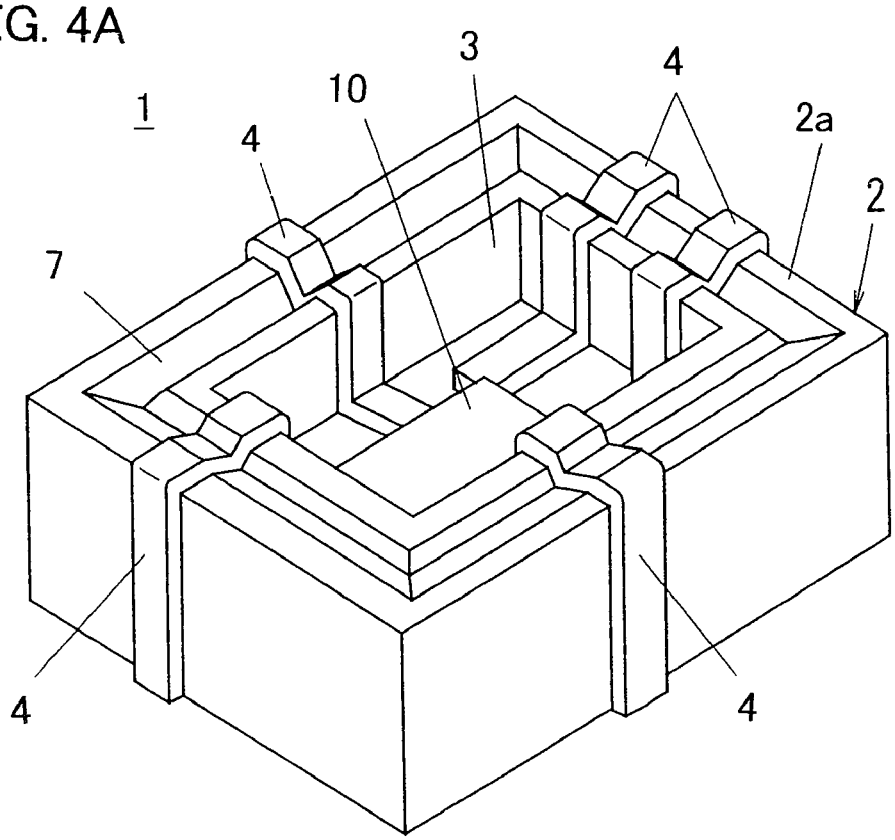
FIG. 4A is a perspective view showing a configuration of an electronic component in accordance with a second embodiment of the present invention, and showing a state before filling up an encapsulation resin into a reception concavity and before forming a stopper resin layer.
Figure 4B:
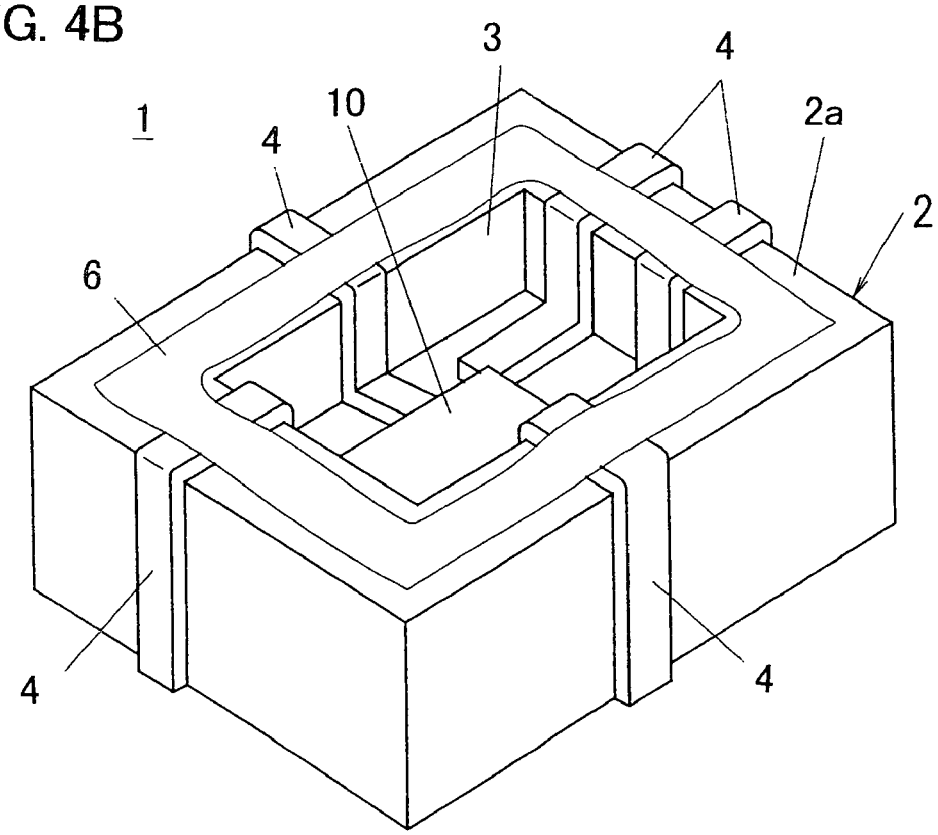
FIG. 4B is a perspective view showing a configuration of the electronic component in accordance with the second embodiment of the present invention, and showing a state before filling up the encapsulation resin into the reception concavity but after forming the stopper resin layer.

FIG. 4A is a perspective view showing a configuration of an electronic component 1 in accordance with the second embodiment, and showing a state before filling up an encapsulation resin into a reception concavity 3 and before forming a stopper resin layer 6, and FIG. 4B is a perspective view showing a configuration of the electronic component 1 in accordance with the second embodiment, and showing a state before filling up the encapsulation resin into the reception concavity 3 but after forming the stopper resin layer 6.

In the second embodiment, as shown in FIG. 4A, a groove 7 having a cross-section of substantially V-shape is formed on a top face 2a of a base member 2 along an aperture of the reception concavity 3. Furthermore, each electric conductive pattern 4 is formed along the substantially V-shaped section of the groove 7. Still furthermore, the stopper resin layer 6 is formed by filling up a resin into the groove 7 as shown in FIG. 4B.

According to the configuration of the second embodiment, when synthetic resin having low viscosity before hardening is used as a material of the stopper resin layer 6, it is possible to utilize fluidity of the resin on occasion of filling it into the groove 7. Therefore, formation of the stopper resin layer 6 becomes easy. Furthermore, since a top face of the stopper resin layer 6 can be formed flat, it is possible to fill up an encapsulation resin with using a die (not shown) which can contact with the top face of the stopper resin layer 6 without clearance, and cover the reception concavity 3.

Figure 5:
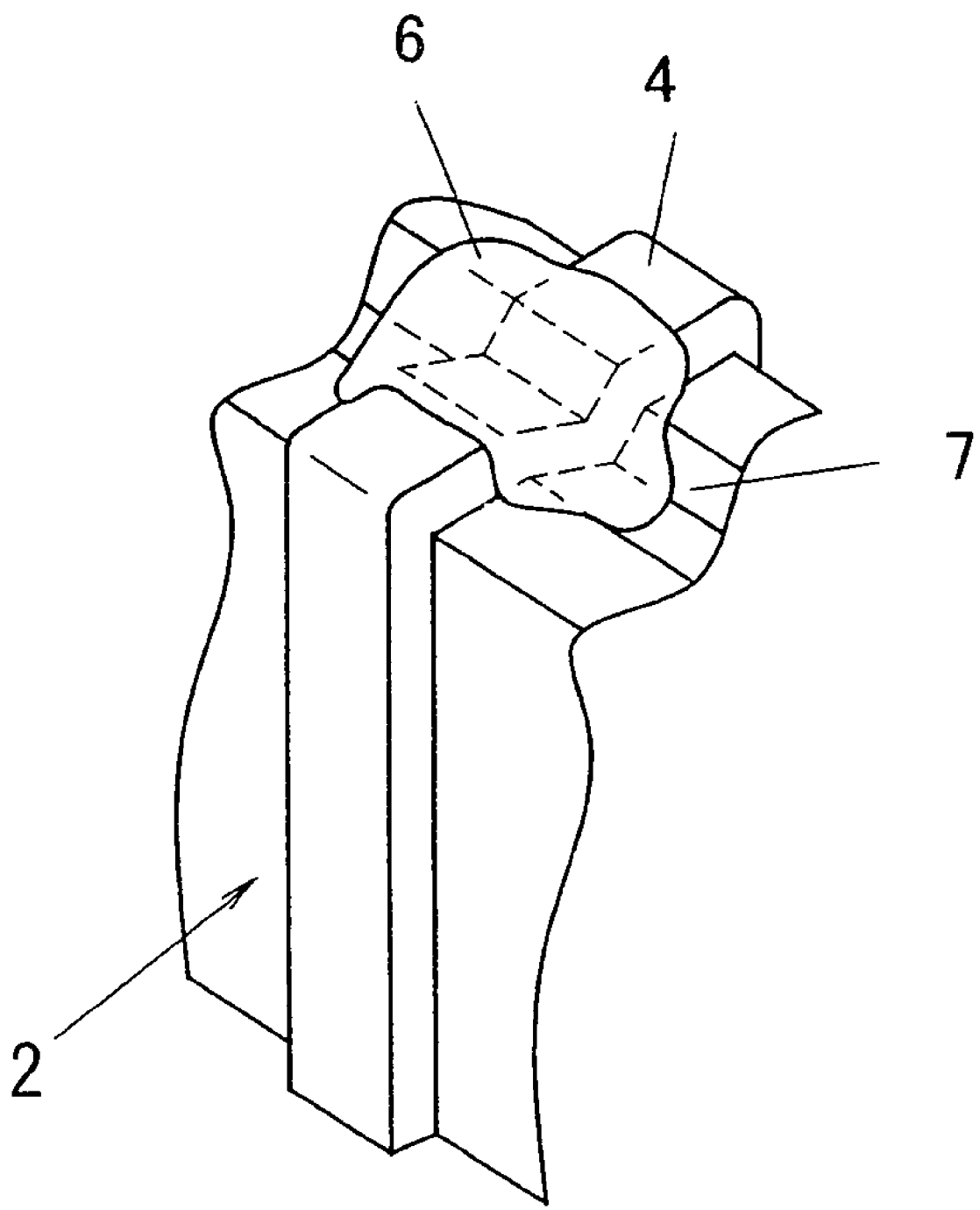
FIG. 5 is a perspective view showing an essential portion of another configuration of an electronic component in accordance with the second embodiment of the present invention.
Figure 6A:
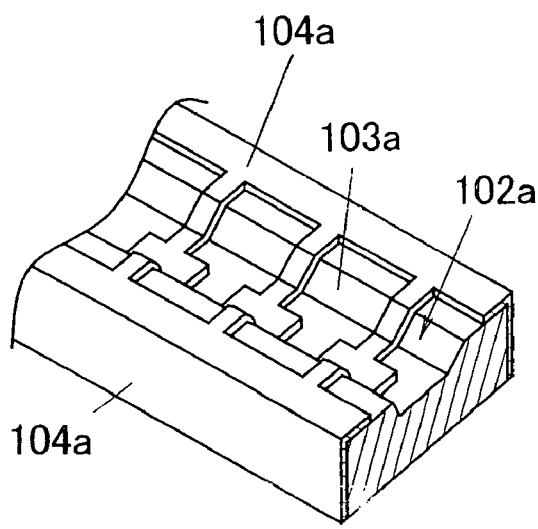
FIGS. 6A to 6D are perspective views each showing a process in a conventional manufacturing method of electronic component.
Figure 6B:
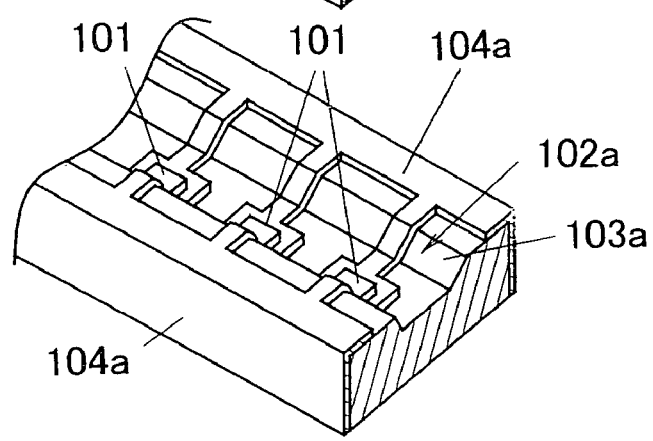
Figure 6C:
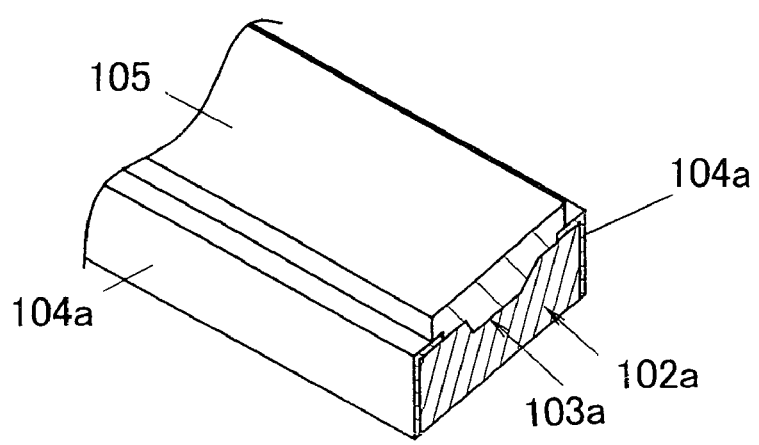
Figure 6D:
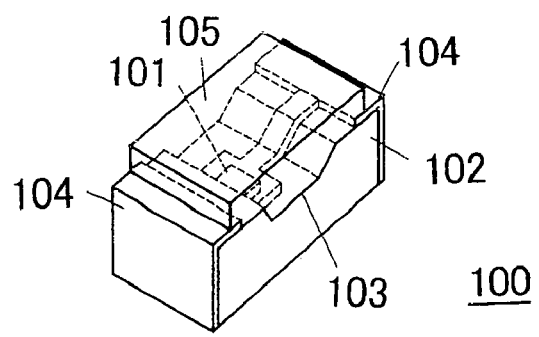
Figure 7A:
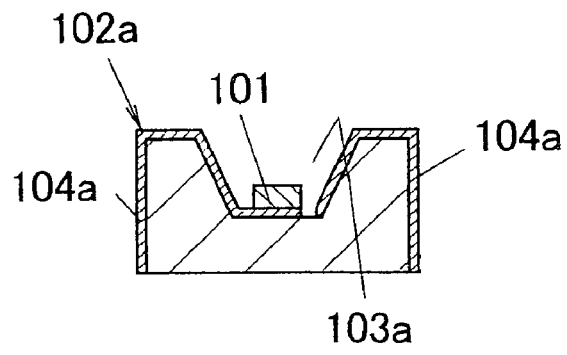
FIGS. 7A to FIG. 7D are sectional views each showing a process to fill up a reception concavity with an encapsulation resin in the above conventional manufacturing method of electronic component.
Figure 7B:
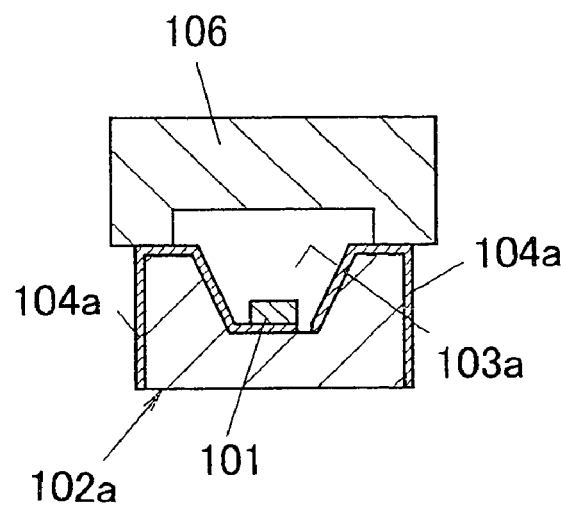
Figure 7C:
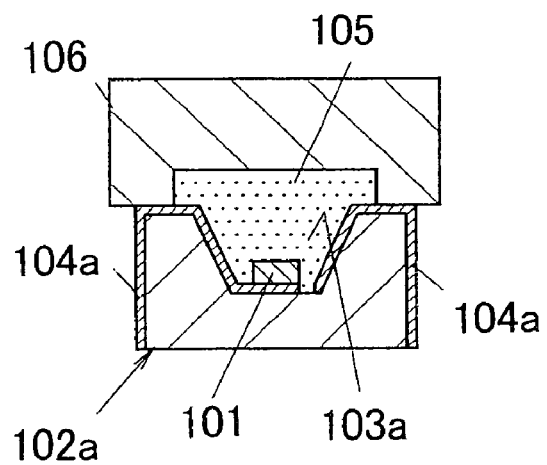
Figure 7D:
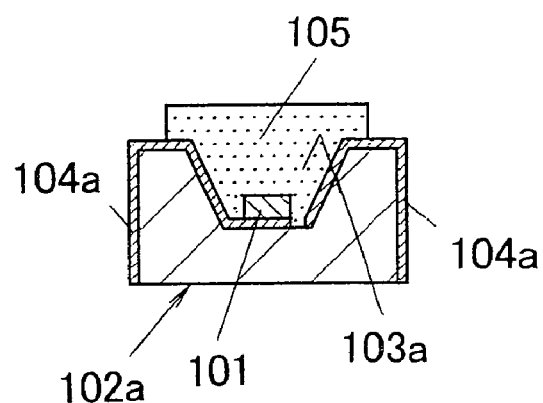
Figure 8:
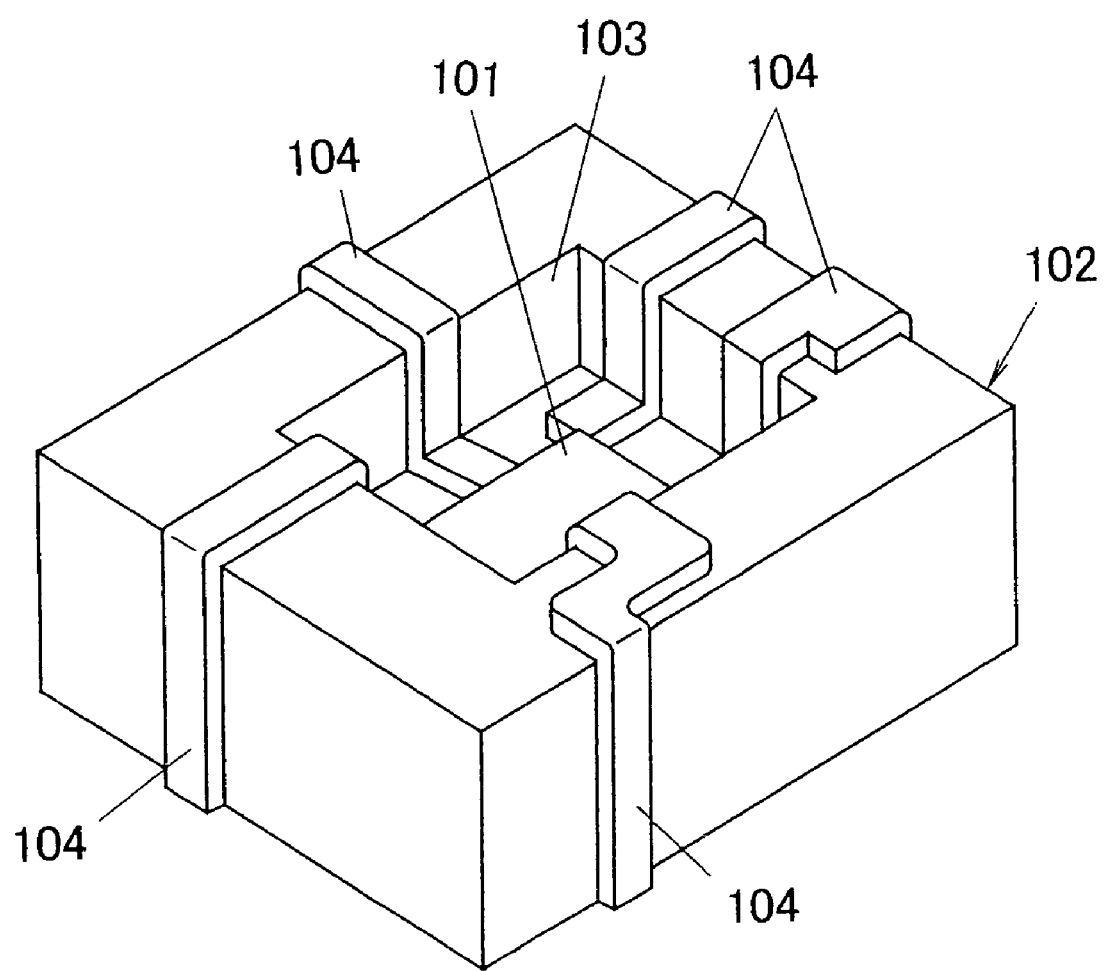
FIG. 8 is a perspective view showing a configuration another conventional electronic component before filling up an encapsulation resin.
Figure 9A:
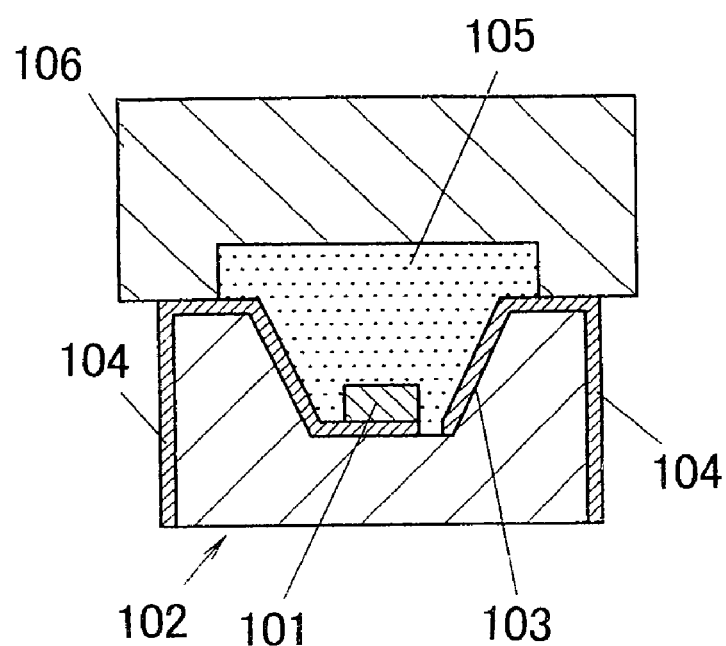
FIG. 9A is a sectional view showing an example of a method for filling up an encapsulation resin into a reception concavity of the above another conventional electronic component.
Figure 9B:
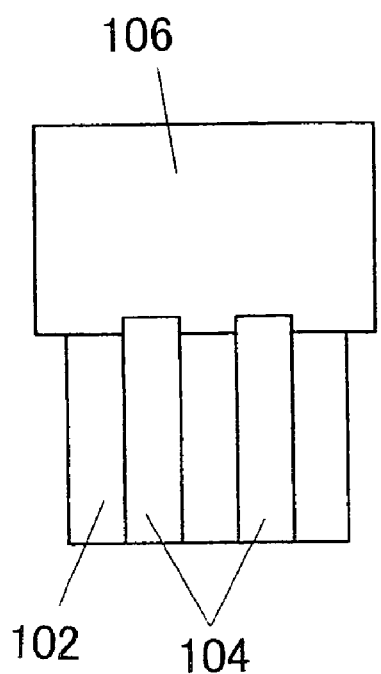
FIG. 9B is a side view of FIG. 9A.
Figure 9C:
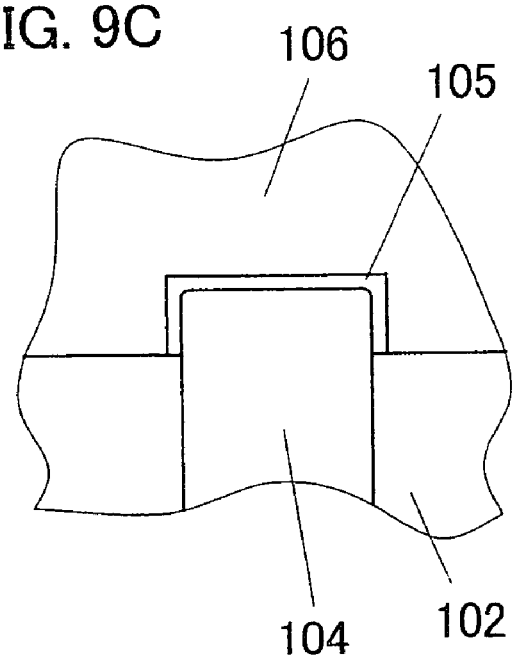
FIG. 9C is an enlarged view of an essential portion of FIG. 9B.

Alternatively, when the die is not use on the occasion of filling the encapsulation resin, it is possible to form the stopper resin layer 6 by filling a resin only in the vicinity of each electric conductive pattern 4, as shown in FIG. 5, instead of forming the stopper resin layer 6 by filling the resin into entire of the groove 7. In such a case, a necessary quantity of the resin can be reduced.

In addition, the electronic component in accordance with the present invention is not limited to the description of the above embodiment, and it is sufficient to comprise at least a base member formed of an insulative material and having a reception concavity into which a semiconductor device is mounted, one or a plurality of electric conductive patterns formed along at least a bottom face and side faces of the reception concavity, and a top face of the base member on which an aperture of the reception concavity is formed among the base member, and electrically connected to the semiconductor device in the reception concavity, an encapsulation resin filled up in the reception concavity, and a stopper resin layer formed on the top face of the base member for covering at least boundaries of the electric conductive pattern and the base member in directions parallel to peripheries of the aperture of the reception concavity so as to prevent leakage or proceeding due to capillarity of the encapsulation resin.

According to such a configuration, on occasion of filling up the encapsulation resin of low viscosity into the reception concavity, even though the encapsulation resin proceeds along at least boundaries between the electric conductive patterns and the base member by capillarity, the leakage or the proceeding due to capillarity of the encapsulation resin can be prevented by the stopper resin layer. As a result, formation of flash by leaked encapsulation resin or diffusion of the encapsulation resin on the electric conductive patterns can be prevented. Furthermore, the stopper resin layer can be formed partially, so that necessary quantity of resin for forming the stopper resin layer can be reduced.

Furthermore, the stopper resin layer may be formed to cover at least overall width of the electric conductive pattern in directions parallel to a circumference of the aperture of the reception concavity. In such a case, even when the electric conductive pattern is easily wetted by the encapsulation resin corresponding to combination of surface property of the electric conductive pattern and property of the encapsulation resin, the proceeding of the encapsulation resin is prevented by the stopper resin layer on the electric conductive pattern, so that the encapsulation resin may not be diffused and adhered at various portion on the surface of the electric conductive pattern, and thereby, conductive failure may not occur between the electric conductive pattern and a circuit board to which the electronic component is to be mounted.

Furthermore, the stopper resin layer may be formed along entire circumference of the aperture of the reception concavity including on the electric conductive pattern. In such a case, even if the encapsulation resin becomes from the aperture of the reception concavity, the encapsulation resin is stemmed by the stopper resin layer. As a result, it is possible to prevent formation of flash or diffusion on the electric conductive pattern of the encapsulation resin.

Still furthermore, a groove may be formed on the top face of the base member along entire circumference of the aperture of the reception concavity, a part of the electric conductive pattern may be formed along side faces and a bottom face of the groove, and the stopper resin layer may be formed by filing a resin in the groove. In such a case, a material having low viscosity can be used as that of the stopper resin layer, so that the stopper resin layer can be formed with a uniform thickness in the inside of the groove with utilizing fluidity of the resin. As a result, formation process of the stopper resin layer can be simplified although the shape of the base member becomes a little complex.

Still furthermore, a material having a viscosity higher than that of a material of the encapsulation resin may be used as a material of the stopper resin layer. Thereby, even when the stopper resin layer has not been hardened completely, it is possible to prevent the leakage or proceeding due to capillarity of the encapsulation resin by the stopper resin layer.

On the other hand, the manufacturing method of electronic component in accordance with the present invention may relates to the manufacturing method of electronic component that a semiconductor device is mounted in a reception concavity of a base member and an encapsulation resin is filled into the reception concavity, and it may comprise the steps of applying a resin on a top face of the base member for covering at least boundaries of an electric conductive pattern and the base member in directions parallel to peripheries of an aperture of the reception concavity so as to form a stopper resin layer for preventing leakage or proceeding due to capillarity of the encapsulation resin, after mounting the semiconductor device in the reception concavity and before filling up an encapsulation resin into the reception concavity.

Furthermore, the stopper resin layer may be formed by applying a resin so as to cover at least entire width of the electric conductive pattern in a direction parallel to circumference of an aperture of the reception concavity. Alternatively, the stopper resin layer may be formed by applying a resin along entire circumference of an aperture of the reception concavity including on the electric conductive pattern. Still furthermore, the stopper resin layer may be formed by filling a resin into a groove which is formed on a top face along entire circumference of an aperture of the reception concavity.

This application is based on Japanese patent application 2004-188781 filed in Japan, the contents of which are hereby incorporated to this invention by references of description and drawings of the above patent application.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

The invention claimed is:

1. An electric component comprising:
    a base member formed of an insulative material and having a reception concavity into which a semiconductor device is mounted;
    one or a plurality of electric conductive patterns formed along at least a bottom face and side faces of the reception concavity, and a top face of the base member on which an aperture of the reception concavity is formed among the base member, and electrically connected to the semiconductor device in the reception concavity;
    an encapsulation resin filled up in the reception concavity; and a stopper resin layer formed on the top face of the base member for covering at least boundaries of the electric conductive pattern and the base member in directions parallel to peripheries of the aperture of the reception concavity so as to prevent leakage or proceeding due to capillarity of the encapsulation resin.

2. The electronic component in accordance with claim 1, wherein
the stopper resin layer is formed to cover at least overall width of the electric conductive pattern in directions parallel to a circumference of the aperture of the reception concavity.

3. The electronic component in accordance with claim 1, wherein
the stopper resin layer is formed along entire circumference of the aperture of the reception concavity including on the electric conductive pattern.

4. The electronic component in accordance with claim 1, wherein
a groove is formed on the top face of the base member along entire circumference of the aperture of the reception concavity;
a part of the electric conductive pattern is formed along side faces and a bottom face of the groove; and
the stopper resin layer is formed by filling a resin into the groove.

5. The electronic component in accordance with claim 1, wherein
a material having a viscosity higher than that of a material of the encapsulation resin is used as a material of the stopper resin layer.

6. A manufacturing method of electronic component, that a semiconductor device is mounted in a reception concavity of a base member and an encapsulation resin is filled into the reception concavity, comprising steps of applying a resin on a top face of the base member for covering at least boundaries of an electric conductive pattern and the base member in directions parallel to peripheries of an aperture of the reception concavity so as to form a stopper resin layer for preventing leakage or proceeding due to capillarity of the encapsulation resin, after mounting the semiconductor device in the reception concavity and before filling up an encapsulation resin into the reception concavity.

7. The manufacturing method of electronic component in accordance with claim 6, wherein
the stopper resin layer is formed by applying a resin so as to cover at least entire width of the electric conductive pattern in a direction parallel to circumference of an aperture of the reception concavity.

8. The manufacturing method of electronic component in accordance with claim 6, wherein
the stopper resin layer is formed by applying a resin along entire circumference of an aperture of the reception concavity including on the electric conductive pattern.

9. The manufacturing method of electronic component in accordance with claim 6, wherein
the stopper resin layer is formed by filling a resin into a groove which is formed on a top face along entire circumference of an aperture of the reception concavity.

* * * * *